United States Patent
Ikeuchi et al.

(10) Patent No.: US 8,658,247 B2
(45) Date of Patent: Feb. 25, 2014

(54) FILM DEPOSITION METHOD (75) Inventors: Toshiyuki Ikeuchi, Yamanashi (JP);
Pao-Hwa Chou, Yamanashi (JP);
Kazuya Yamamoto, Yamanashi (JP);
Kentaro Sera, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 63 days.

(21) Appl. No.: 13/189,648

(22) Filed: Jul. 25, 2011

(65) Prior Publication Data
US 2012/0190215 A1 Jul. 26, 2012

(30) Foreign Application Priority Data

Jul. 29, 2010 (JP) .................................. 2010-170758
May 10, 2011 (JP) .................................. 2011-105146

(51) Int. Cl.
C23C 16/40 (2006.01)

(52) U.S. Cl.
USPC ........... 427/255.23; 427/255.29; 118/723 VE (58) Field of Classification Search
USPC ............... 427/248.1, 255.23, 255.26, 255.29;
118/723 VE; 117/84
See application file for complete search history.

(56) References Cited

U.S. PATENT DOCUMENTS

| | | | |
|---|---|---|---|
| 6,767,582 B1 * | 7/2004 | Elers | 427/253 |
| 2003/0059535 A1 * | 3/2003 | Luo et al. | 427/255.28 |
| 2003/0203113 A1 * | 10/2003 | Cho et al. | 427/255.23 |
| 2004/0151845 A1 * | 8/2004 | Nguyen et al. | 427/569 |
| 2005/0103264 A1 * | 5/2005 | Jansen | 118/715 |
| 2006/0032442 A1 | 2/2006 | Hasebe | |
| 2006/0125030 A1 * | 6/2006 | Ahn et al. | 257/411 |
| 2007/0072424 A1 * | 3/2007 | Lee et al. | 438/690 |
| 2009/0056877 A1 * | 3/2009 | Matsuura et al. | 156/345.48 |
| 2011/0021033 A1 * | 1/2011 | Ikeuchi et al. | 438/758 |
| 2011/0198736 A1 * | 8/2011 | Shero et al. | 257/629 |

FOREIGN PATENT DOCUMENTS

| | | | |
|---|---|---|---|
| JP | 09-077593 | | 3/1997 |
| JP | 2004-6551 | * | 1/2004 |
| JP | 2006-054432 | | 2/2006 |
| JP | 2006-54432 | * | 2/2006 |
| JP | 2009-81457 | * | 4/2009 |
| JP | 2009-246318 | | 10/2009 |

OTHER PUBLICATIONS

Gordon, Roy G., et al., "A Kinetic Model for Step Coverage by Atomic Layer Deposition in Narrow Holes or Trenches". Chemical Vapor Deposition 2003, 9, No. 2, pp. 73-78.*

* cited by examiner

Primary Examiner — Bret Chen
(74) Attorney, Agent, or Firm — IPUSA, PLLC (57) ABSTRACT

A disclosed film deposition method comprises alternately repeating an adsorption step and a reaction step with an interval period therebetween. The adsorption step includes opening a first on-off valve of a source gas supplying system for a predetermined time period thereby to supply a source gas to a process chamber, closing the first valve after the predetermined time period elapses, and confining the source gas within the process tube, thereby allowing the source gas to be adsorbed on an object to be processed, while a third on-off valve of a vacuum evacuation system is closed. The reaction step includes opening a second on-off valve of a reaction gas supplying system thereby to supply a reaction gas to the process chamber, thereby allowing the source gas and the reaction gas to react with each other thereby to produce a thin film on the object to be processed.

15 Claims, 8 Drawing Sheets

FILM DEPOSITION METHOD

CROSS-REFERENCE TO RELATED APPLICATION

This application claims the benefit of priority of Japanese Patent Applications No. 2010-170758 and 2011-105146, filed on Jul. 29, 2010, and May 10, 2011, respectively with the Japanese Patent Office, the entire contents of which are hereby incorporated by reference.

BACKGROUND OF THE INVENTION

1. Field of the Invention

The present invention relates to a film deposition method and a film deposition apparatus where a silicon oxide film is deposited on an upper surface of an object to be processed such as a semiconductor wafer.

2. Description of the Related Art

Figure 1:
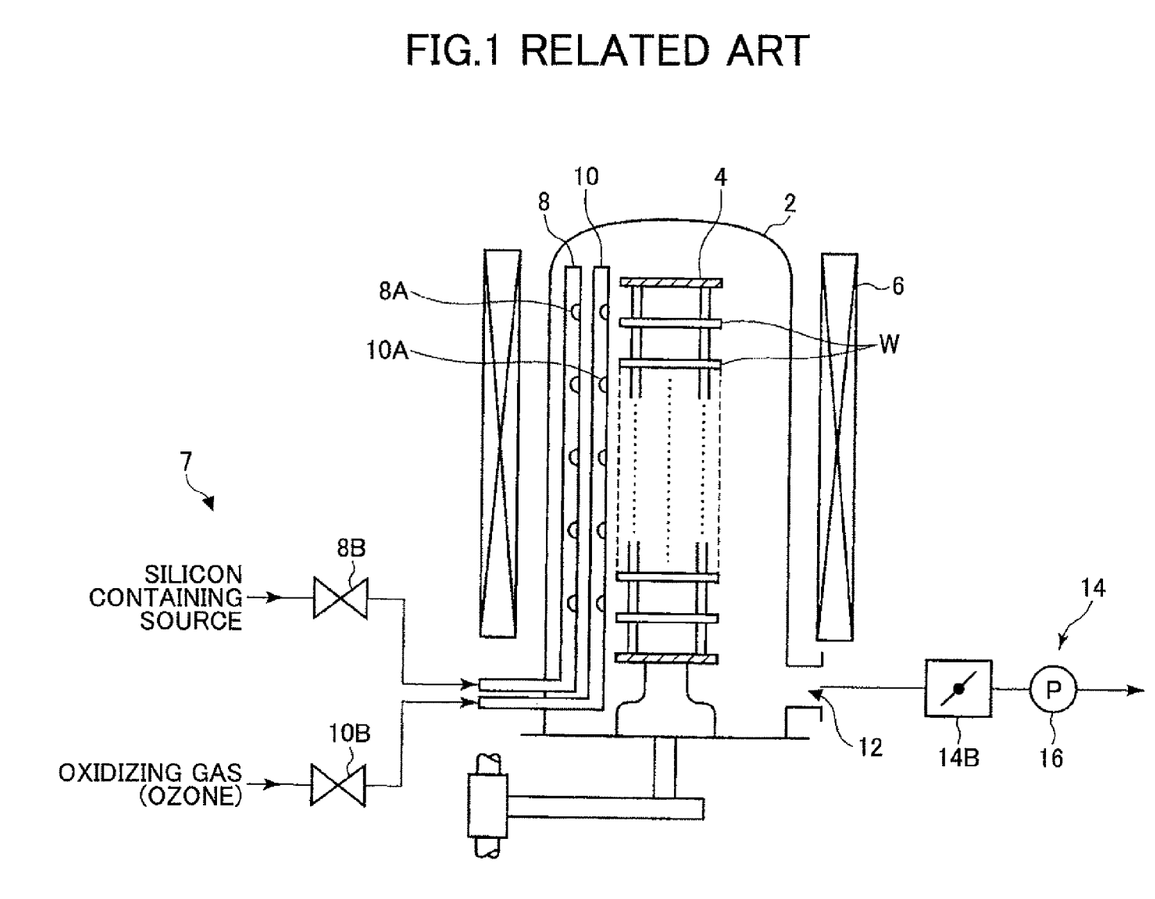
FIG. 1 is a schematic view of a related art batch-type film deposition apparatus.

In order to fabricate semiconductor integrated circuits, various processes such as film deposition, etching, oxidation, diffusion, and alteration processes are carried out with respect to a semiconductor wafer (referred to as a wafer hereinafter) made of silicon or the like. For example, the film deposition process is carried out in a single-wafer film deposition apparatus disclosed, for example, in Patent Document 1 below and in a batch-type film deposition apparatus disclosed, for example, in Patent Document 2. As shown in FIG. 1, the batch-type film deposition apparatus has a wafer boat 4 that is accommodated in a process tube 2 and holds plural wafers serving as objects to be processed in a multistage manner, distribution nozzles 8, 10 that extend along a vertical direction within the process tube 2 and supply source gases toward the wafer boat 4, an evacuation opening 12 provided in a lower portion of the process tube 2, a vacuum evacuation system 14 including a vacuum pump 16, and a heating part 6 that surrounds the process tube 2.

In addition, when a silicon oxide film is deposited on the wafers in the film deposition shown in FIG. 1, the wafer boat 4 that holds plural wafers is accommodated in the process tube 2, and the wafers are heated to about 600° C. by the heating part 6. A silicon-containing gas as a source gas is supplied to the distribution nozzle 8 from a gas supplying part 7, and then supplied toward the wafers W from plural gas ejection holes 8A provided in and along the longitudinal direction of the distribution nozzle 8. In addition, ozone gas as a reaction gas is supplied to the distribution nozzle 10 from the gas supplying part 7, and then supplied toward the wafers W from gas ejection holes 10A provided in and along the longitudinal direction of the distribution nozzle 10. On the other hand, the interior of the process tube 2 is evacuated by the vacuum evacuation system 14, and maintained at a predetermined pressure. The silicon-containing gas and the ozone gas are reacted, and thus the silicon oxide film is deposited on the wafers W.

In addition, another film deposition method may be carried out where the silicon-containing gas and the ozone gas, which is an oxidizing gas, are alternately repeatedly supplied by alternately opening and closing an on-off valve 8B and an on-off valve 10B of the gas supplying part 7, thereby allowing the source gas adsorbed on the wafers W to react with the ozone gas and depositing the silicon oxide film on the wafers W. This film deposition method is advantageous in that properties of the film obtained are relatively excellent and the film deposition can be carried out at relatively lower temperatures.

Patent Document 1: Japanese Patent Application Laid-Open Publication No. H09-077593.

Patent Document 2: Japanese Patent Application Laid-Open Publication No. 2009-246318.

Patent Document 3: Japanese Patent Application Laid-Open Publication No. 2006-054432.

SUMMARY OF THE INVENTION

Incidentally, the silicon oxide film serving as an insulation film may be deposited on a metal film serving as an electrical line in order to form electrical lines in a semiconductor fabrication process. In this case, the metal film, for example, a tungsten film is deposited on a wafer such as a silicon substrate in a previous process, and the wafer is brought to the film deposition apparatus for the silicon oxide deposition while the wafer is exposed to a clean atmospheric environment in a clean room. Alternatively, the wafer is brought within an air-tight wafer carrier inside of which is kept in a clean inert gas environment.

In this case, the upper surface of the tungsten film may be reacted with oxygen or moisture within the clean atmospheric environment in the clean room or only a small amount of oxygen or moisture, which may exist even in the clean inert gas environment within the wafer carrier. As a result, a natural metal oxide film having only a small thickness is formed on or in the upper surface of tungsten film.

Because the naturally-grown metal oxide film may degrade electric properties of a semiconductor device, it is preferable that a thickness of the metal oxide film is prevented from being increased as much as possible or the metal oxide film is removed before the silicon oxide deposition. However, removal of the metal oxide film is not advisable because it leads to an increased number of processes. Therefore, the silicon oxide film is not purposefully deposited on the metal film having the metal oxide film on the top without removing the metal oxide film in the conventional process.

On the other hand, when the silicon oxide film is deposited by a conventional chemical vapor deposition method on the metal film, the metal oxide film on and in the metal film may be thickened by an oxidation gas that is one of the source gases in addition to the silicon-containing gas. As a result, the electric properties of the semiconductor device are relatively greatly degraded (see Patent Document 3). Especially, when a thickness of the metal oxide film is increased, not only the electric properties are degraded but also a needle-like crystal is created, which causes defects.

The present invention has been made in view of the above, and provides a film deposition method and a film deposition apparatus that are capable of controlling a thickness of the metal oxide film that may exist at a boundary of an underlying metal film and a silicon oxide film deposited on the metal film, thereby reducing the thickness of the metal oxide film.

Having vigorously investigated deposition of the silicon oxide film, the inventors of the present application found that diffusion of ozone as the reaction gas may contribute to an increase in the metal oxide film thickness. Based on this finding, the inventors further found that the ozone contribution to the thickness increase can be controlled by increasing an amount of the source gas adsorbed on an upper surface of the object to be processed through confinement of the source gas within the process chamber. With these findings, the present invention has been arrived at.

According to a first aspect of the present invention, there is provided a film deposition method that may be carried out to deposit a silicon oxide film on a metal containing film formed on an object to be processed, using a film deposition apparatus including a process chamber that accommodates the object to be processed; a source gas supplying system that includes a first on-off valve and supplies a source gas to the process chamber; a reaction gas supplying system that includes a second on-off valve and supplies a reaction gas to the process chamber; and a vacuum evacuation system that includes a third on-off valve and evacuates the process chamber to vacuum. The film deposition method comprises alternately repeating an adsorption step and a reaction step with an interval period therebetween. The adsorption step includes opening the first on-off valve of the source gas supplying system for a predetermined time period thereby to supply the source gas to the process chamber, closing the first valve after the predetermined time period elapses, and confining the source gas within the process tube, thereby allowing the source gas to be adsorbed on the object to be processed, while the third on-off valve of the vacuum evacuation system is closed. The reaction step includes opening the second on-off valve of the reaction gas supplying system thereby to supply the reaction gas to the process chamber, thereby allowing the source gas and the reaction gas to react with each other thereby to produce a thin film on the object to be processed.

According to a second embodiment, there is provided a film deposition apparatus comprising a process chamber that accommodates an object to be processed; a holding part that holds the object to be processed; a heating part that heats the object to be processed; a source gas supplying system that includes a first on-off valve and supplies a source gas to the process chamber; a reaction gas supplying system that includes a second on-off valve and supplies a reaction gas to the process chamber; a vacuum evacuation system that includes a third on-off valve and evacuates the process chamber to vacuum; and an apparatus controlling part that controls the film deposition apparatus so that the film deposition method according to the first aspect is carried out therein.

BRIEF DESCRIPTION OF THE DRAWINGS

Accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE PREFERRED EMBODIMENT

According to an embodiment of the present invention, there is provided a film deposition method and a film deposition apparatus that are capable of controlling a thickness of the metal oxide film that may exist at a boundary of an underlying metal film and a silicon oxide film deposited on the metal film, thereby reducing the thickness of the metal oxide film. As a result, not only the thickness of the metal oxide film is reduced thereby preventing degradation of electric properties of a semiconductor device but also structural defects are reduced.

Figure 2:
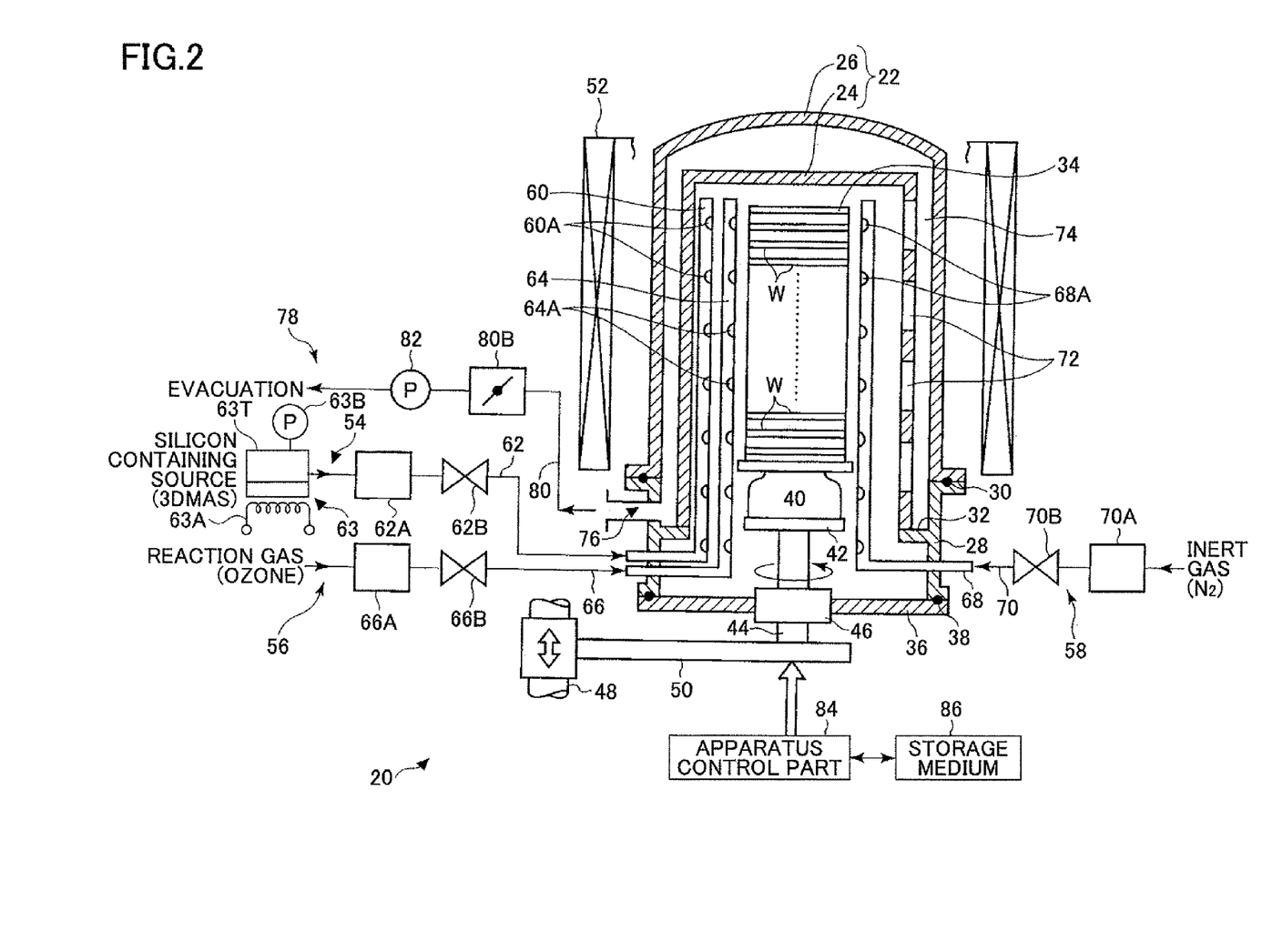
FIG. 2 is a schematic view of a film deposition apparatus according to the embodiment of the present invention.
Figure 3:
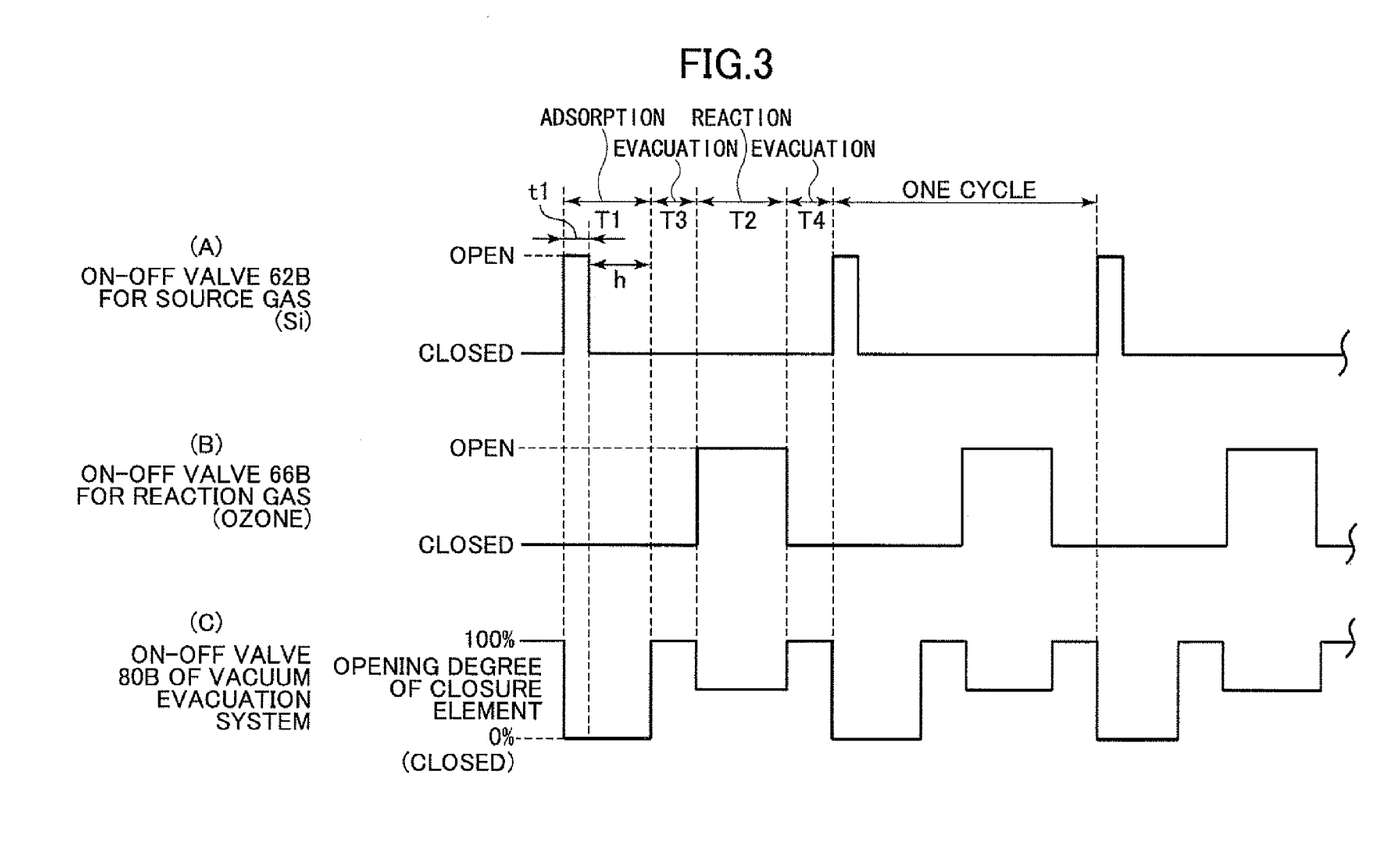
FIG. 3 is a timing chart illustrating operations of on-off valves of the film deposition apparatus of FIG. 2 when a film deposition method according to an embodiment of the present invention is carried out.

A film deposition method and a film deposition apparatus according to embodiments of the present invention are described with reference to the accompanying drawings. FIG. 2 is a schematic view of an example of the film deposition apparatus according to the embodiment of the present invention, and FIG. 3 is a time chart illustrating operations of on-off valves of the film deposition apparatus when the film deposition method according to the embodiment of the present invention is carried out.

In the following an example is described where a silicon oxide film is deposited using a tris(dimethylamino)silane ($SiH(N(CH3)2)3$): 3DMAS) gas, which is a silicon-containing organic material, a source gas, and an ozone gas, which is an oxidation gas, as a reaction gas.

As shown in FIG. 2, a film deposition apparatus 20 includes a process tube 22 that may accommodate plural semiconductor wafers W as objects to be processed. The process tube 22 has a double tube structure composed of a vertically long inner tube 24 having a cylindrical shape with a lid at the top and a vertically long outer tube 26 having a cylindrical shape with a lid at the top. The outer tube 26 surrounds the inner tube 24 with a predetermined gap between the outer circumferential surface of the inner tube 24 and the inner circumferential surface of the outer tube 26.

The inner tube 24 and the outer tube 26 are made of, for example, quartz, and have bottom openings. A diameter of the process tube 22 (the outer tube 26) is about 400 to 500 mm when the wafers W have diameters of 300 mm. An inner volume of the process tube 22 depends on the number of the wafers W accommodated in the process tube 22, and is about 200 liters when up to 150 wafers are accommodated.

A bottom end of the outer tube 26 is connected to a manifold 28 that is made of, for example, stainless steel and has a cylindrical shape, by way of a sealing member 30 such as an O-ring. In other words, the outer tube 26 is supported at the bottom end thereof by the manifold 28. Incidentally, the manifold 28 is supported by a base plate (not shown). In addition, a supporting pedestal 32 having a ring shape is provided in the inner wall of the manifold 28. The supporting pedestal 32 supports a bottom end of the inner tube 24.

A wafer boat 34 serving as a wafer holding part is accommodated within the inner tube 24 of the process tube 22. The wafer boat 34 holds plural wafers W as objects to be processed at a predetermined pitch. In this embodiment, for example, the 50 to 100 wafers W having a diameter of 300 mm are held at an equal pitch in a multistage manner by the wafer boat 34. The wafer boat 34, which is elevatable as described later, is loaded/unloaded into/from the inner tube 24 through the bottom opening of the manifold 28. The wafer boat 34 is made of, for example, quartz.

In addition, when the wafer boat 34 is accommodated in the inner tube 24, the bottom opening of the manifold 28, which corresponds to a bottom end of the process tube 22, is closed by a lid part 36, which is made, for example, quartz or stainless steel. A sealing member 38 such as an O-ring is provided between the bottom end of the process tube 22 and the lid part 36. The wafer boat 34 is placed on a table 42 by way of a warmth keeping cylinder 40, which is made of, for example, quartz. The table 42 is supported on an upper part of a rotation shaft 44 that goes through the lid part 36 that opens and closes the bottom opening of the manifold 28.

A magnetic fluid seal 46 is provided between the rotation shaft 44 and a hole that the rotation shaft 44 goes through, and thus the rotation shaft 44 is rotatably supported in an air-tight manner. The rotation shaft 44 is attached on a distal end of an arm 50 supported by an elevation mechanism 48 such as a boat elevator, and thus is capable of moving the wafer boat 34, the lid part 36, or the like in unison. Incidentally, the table 42 may be fixed on the lid part 36. In this case, the film is deposited on the wafers W without rotating the wafer boat 34.

A heating part 52, which is made of, for example, a carbon wire heater, is provided so that the process tube 22 is surrounded by the heating part 52. With this, the process tube 22 and the wafers W within the process tube 22, which are positioned inside the heating part 52, are heated. A source gas supplying system 54 that supplies a source gas, a reaction gas supplying system 56 that supplies a reaction gas, and a purge gas supplying system 58 that supplies an inert gas as a purge gas are provided in the manifold 28.

Specifically, the source gas supplying system 54 includes a gas nozzle 60 that is made of, for example, quartz, has an L-shape, and goes through the manifold 28 in an air-tight manner. The gas nozzle 60 extends inside and substantially entirely along the inner tube 24. The gas nozzle 60 has plural gas ejection holes 60A that are formed at predetermined pitches. The source gas is supplied transversely toward the wafers W held by the wafer boat 34 through the gas ejection holes 60A. The gas nozzle 60 is connected to a gas passage 62.

The gas passage 62 is provided with a flow rate controller 62A such as a mass flow controller and an on-off valve 62B that starts and terminates (or shuts off) a flow of gas, so that the source gas can be supplied to the gas nozzle 60 at a controlled flow rate as may be necessary and terminated. In this embodiment, the 3DMAS, which contains silicon is used as the source gas. The 3DMAS, which is liquid at a normal temperature, is vaporized by an evaporator 63 and transported by a carrier gas. Specifically, a vapor pressure of the 3DMAS is controlled by adjusting a temperature of the 3DMAS using the evaporator 63, thereby controlling an amount of the evaporated 3DMAS. As the carrier gas, an inert gas including a nitrogen gas and a noble gas such as argon (Ar) and helium (He) is used. However, the vaporized 3DMAS gas may be transported without using the carrier.

In this embodiment, a baking type evaporator is used as the evaporator 63. The evaporator of this type includes a source tank 63T that stores the 3DMAS and a heater 63A that heats the source tank 63T. The 3DMAS is heated and evaporated by heating the 3DMAS within the source tank 63T and the evaporated 3DMAS is directly introduced into the process tube 22. In this case, the carrier gas is not used. In addition, the evaporator 63 is provided with a pressure gauge 63B, and a temperature of the 3DMAS is controlled so that a vapor pressure of the 3DMAS is greater than a pressure in the process tube 22. Such control is carried out by the temperature controller (not shown).

In addition, an injection type evaporator may be used as the evaporator 63. In this type of the evaporator, after the evaporator is started, the evaporated 3DMAS needs to be evacuated through a by-pass line, without flowing through the process tube 22, for 5 to 10 seconds in order to stabilize a flow rate of the evaporated 3DMAS. This means that the organic material, which is relatively expensive, needs to be wasted. Therefore, the baking type evaporator is preferably used from a viewpoint of effective utilization of the source material.

In addition, the reaction gas supplying system 56 includes a gas nozzle 64 that is made of, for example, quartz, has an L-shape, and goes through the manifold 28 in an air-tight manner. The gas nozzle 64 extends inside and substantially entirely along the inner tube 24. The gas nozzle 64 has plural gas ejection holes 64A that are formed at predetermined pitches. The reaction gas is supplied transversely toward the wafers W held by the wafer boat 34 through the gas ejection holes 64A. The gas nozzle 64 is connected to a gas passage 66. The gas passage 66 is provided with a flow rate controller 66A such as a mass flow controller and an on-off valve 66B that starts and terminates (or shuts off) a flow of gas, so that the reaction gas can be supplied to the gas nozzle 64 at a controlled flow rate as may be necessary and terminated. In this embodiment, ozone ($O_3$) gas is used as the reaction gas, described above.

In addition, the purge gas supplying system 58 includes a gas nozzle 68 that is made of, for example, quartz, has an L-shape, and goes through the manifold 28 in an air-tight manner. The gas nozzle 68 extends inside and substantially entirely along the inner tube 24. The gas nozzle 68 has plural gas ejection holes 68A that are formed at predetermined pitches. The purge gas is supplied transversely toward the wafers W held by the wafer boat 34 through the gas ejection holes 68A. The gas nozzle 68 is connected to a gas passage 70. The gas passage 70 is provided with a flow rate controller 70A such as a mass flow controller and an on-off valve 70B that starts and terminates (or shuts off) a flow of gas, so that the purge gas can be supplied to the gas nozzle 68 at a controlled flow rate as may be necessary and terminated. In this embodiment, a nitrogen gas is used as the purge gas, described above. In other embodiments, an inert gas such as argon (Ar) and helium (He) may be used as the purge gas instead of the nitrogen gas.

In addition, the gas nozzles 60, 64, 68 are positioned in one side of the inside of the inner tube 24, although the gas nozzle 68 is illustrated on the other side of the gas nozzles 60 and 64, for the sake of illustrating convenience. Plural openings 72 having relatively large diameters are provided in the circumferential wall of the inner tube 24 along the vertical direction so that the openings 72 are positioned across the wafer boat 34 with respect to the gas nozzles 60, 64, 68 when the wafer boat 34 is accommodated in the inner tube 24. With this, the gases supplied to the corresponding gas nozzles 60, 64, 68 horizontally flow between the wafers W and are guided to a gap 74 between the inner tube 24 and the outer tube 26 through the openings 72.

An evacuation opening 76 is formed to allow the inner tube 24 to be in gaseous communication with the outer tube 26 on an upper part of the manifold 28. The evacuation opening 76 is connected to a vacuum evacuation system 78 that evacuates the process tube 22 to vacuum. Specifically, the vacuum evacuation system 78 has an evacuation passage 80 connected to the evacuation opening 76. In addition, the evacuation passage 80 has an on-off valve 80B that changes an opening degree of a closure element inside thereof in order to control an inner pressure of the process tube 22, and a vacuum pump 82 in this order. With this, the process tube 22 can be evacuated at a controlled pressure. The closure element of the on-off valve 80B provided in the evacuation passage 80 can be arbitrarily adjusted within a range from "fully open position" through "fully closed position". In addition, when the closure element is fully closed, the gas flow from the process tube 22 is completely shut off by the on-off valve 80B.

In addition, the film deposition apparatus 20 is provided with an apparatus control part 84 that is composed of, for example, a computer and controls entire operations of the film deposition apparatus 20. The apparatus control part 84 controls starting and terminating the flows of gas, on-off operations of the valves including adjustment of the opening degree of the closure element of the pressure control valve 80B, a process pressure, a process temperature, and the like, thereby carrying out the film deposition process in the film deposition apparatus 20. Such control is carried out by executing a computer program that controls the entire operations of the film deposition apparatus 20. The computer program is stored in a computer readable storage medium 86, and downloaded into the apparatus control part 84. As the computer readable storage medium 86, a flexible disk, a compact disk (CD), a hard disk, a flash memory, a digital versatile disk (DVD), and the like may be used.

Figure 4:
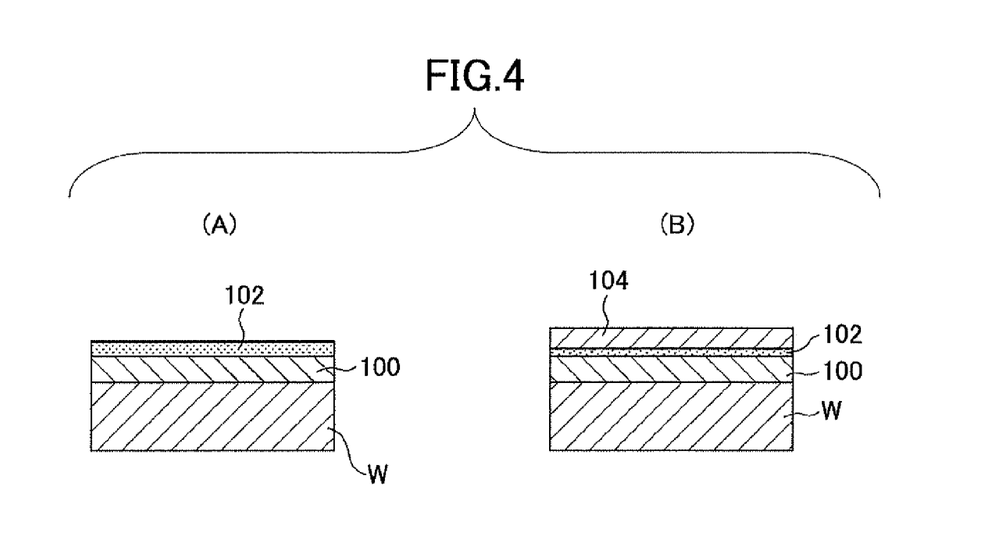
FIG. 4 is an enlarged cross-sectional view that schematically illustrates a cross section of a multilayer film formed by the film deposition method.
Figure 5:
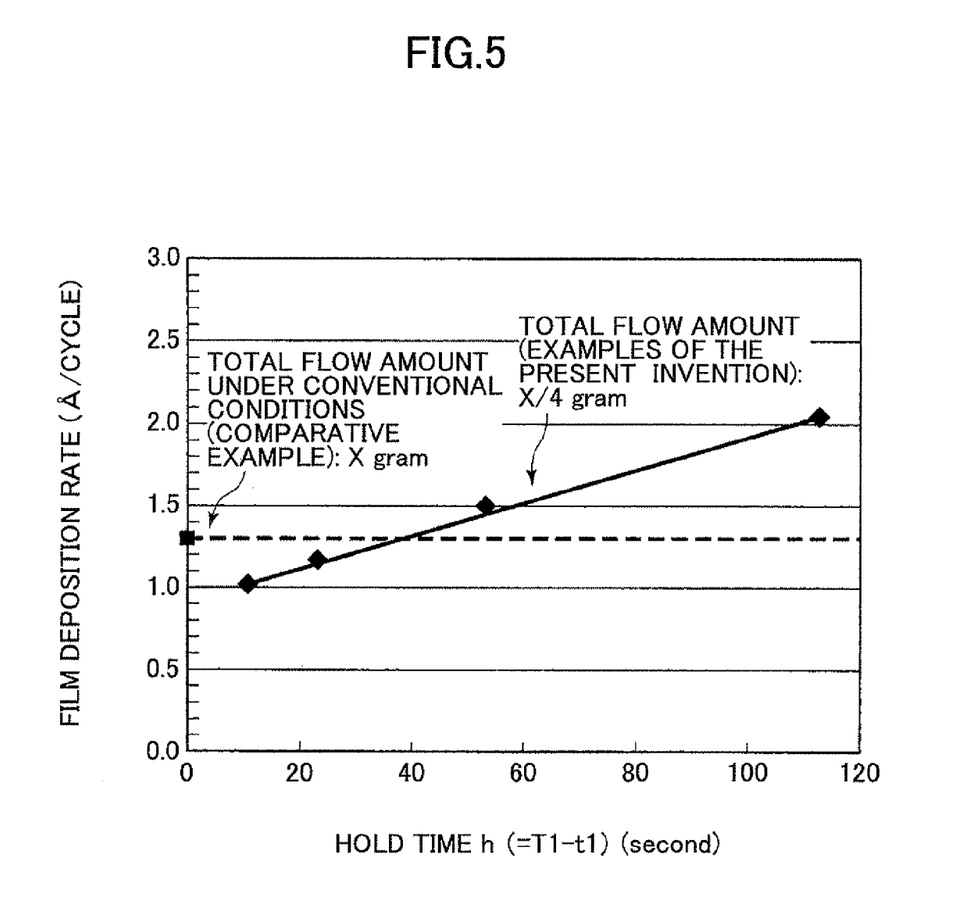
FIG. 5 is a graph that illustrates a relationship between a hold period of the source gas and a film deposition rate per cycle.
Figure 6:
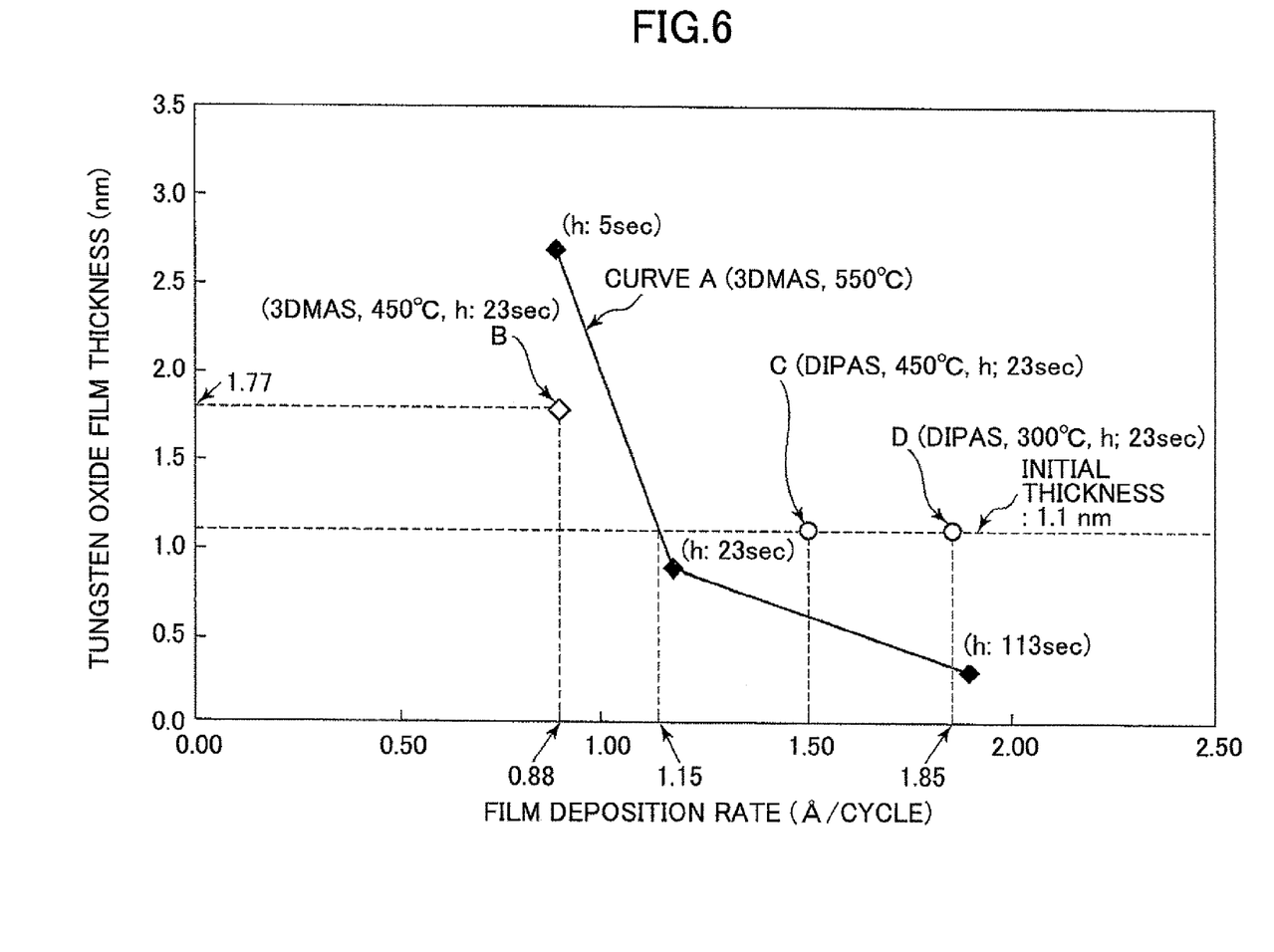
FIG. 6 is a graph that illustrates a relationship between the film deposition rate per cycle and a film thickness of a metal oxide film.
Figure 7:
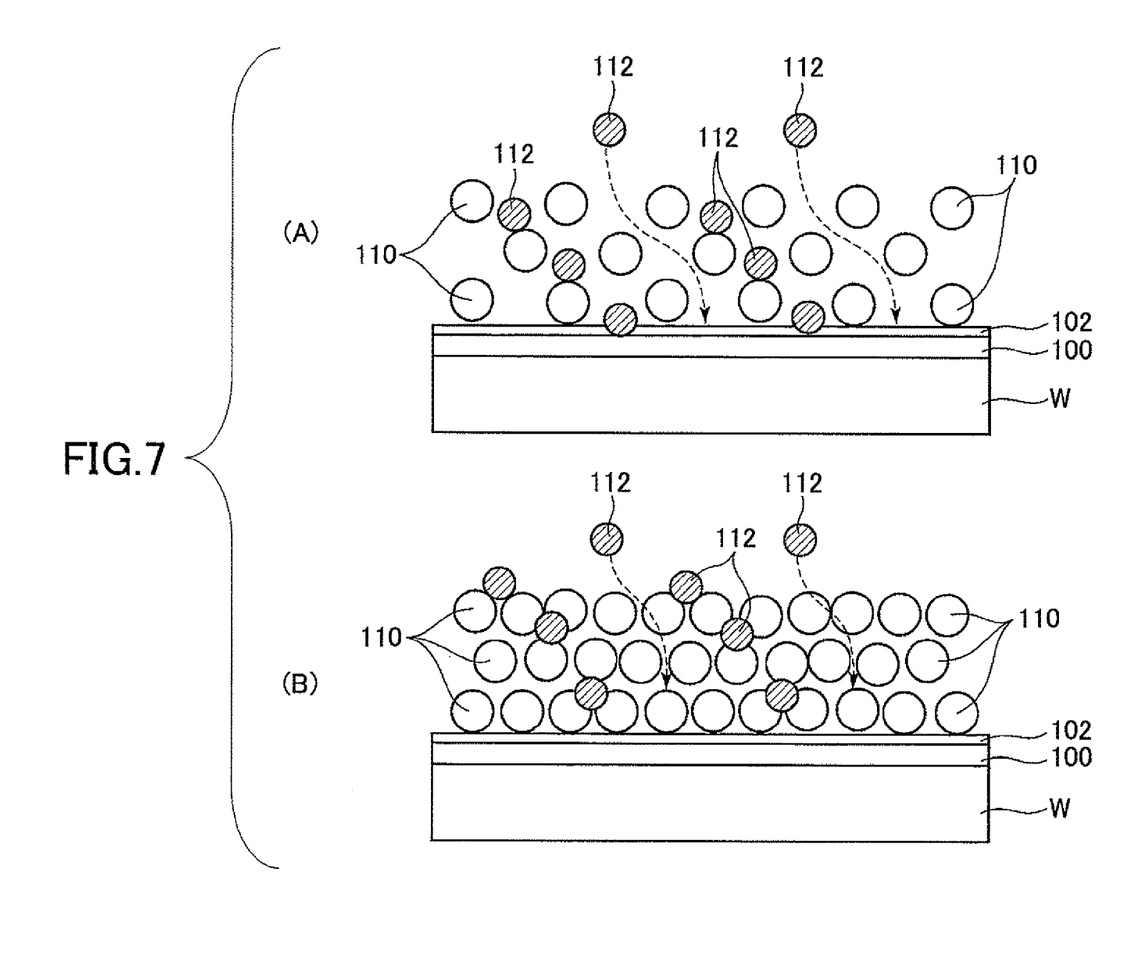
FIG. 7 is an explanatory view for explaining a reason why a metal film is oxidized at a boundary between a metal containing film and a silicon oxide film deposited on the metal film.

Next, a film deposition method according to an embodiment of the present invention, which is preferably carried out in the film deposition apparatus 20 described above, is explained with reference to FIG. 4 through 7. FIG. 4 is an enlarged cross-sectional view that schematically illustrates a cross section of a multilayer film formed by the film deposition method; FIG. 5 is a graph that illustrates a relationship between a hold period of the source gas and a film deposition rate per cycle; FIG. 6 is a graph that illustrates a relationship between the film deposition rate per cycle and a film thickness of a metal oxide film; and FIG. 7 is an explanatory view for explaining a reason why a metal film is oxidized at a boundary between the metal film and a silicon oxide film deposited on the metal film. Incidentally, the operations of the film deposition apparatus 20 are carried out based on the program stored in the computer readable storage medium 86.

In addition, the wafers W are silicon wafers on which a tungsten film as a metal-containing film is deposited in a previous process, in this embodiment. The wafers W are housed in a wafer carrier and transported from a metal film deposition used in the previous process to the film deposition apparatus 20. An atmospheric environment that is the same as the environment of a clean room, or a clean inert gas environment, is kept in the wafer carrier. The upper surface of the tungsten film is exposed to oxygen or moisture in the atmospheric environment, or oxygen or moisture that may exist, even if only a tiny amount, in the clean inert gas environment. As a result, a natural metal oxide film is formed on or in the upper surface of the tungsten film.

The wafer boat 34 is removed downward through the bottom opening of the manifold 28 and held below the process tube 22, so that the wafer boat 34 is cooled to a normal temperature. Then, plural (e.g., fifty) of the wafers W are loaded in the wafer boat 34, and the wafer boat 34 is brought upward into the process tube 22. The bottom opening of the process tube 22 (the bottom opening of the manifold 22) is closed by the lid part 36, and thus the process tube 22 is closed in an air-tight manner.

Incidentally, a temperature inside the process tube 22 is kept at a temperature that is higher than a normal temperature and lower than a film deposition temperature.

Next, the vacuum pump 82 of the vacuum evacuation system 78 is started, so that the process tube 22 is evacuated to vacuum; and the inner pressure of the process tube 22 is kept at a predetermined process pressure by the on-off valve 80B. During the film deposition process, the vacuum pump 82 and the on-off valve 80B are continuously operated.

In addition, by increasing electric power supplied to the heating part 52, the wafers W are heated to the film deposition temperature. After the film deposition temperature is stabilized, the source gas, the reaction gas, and the like are supplied at controlled flow rates.

Specifically, the 3DMAS gas as the silicon-containing gas is supplied from the gas nozzle 60 of the source gas supplying system 54; the ozone gas is supplied from the gas nozzle 64 of the reaction gas supplying system 56; and $N_2$ gas as a purge gas is supplied from the gas nozzle 68 of the purge gas supplying system 58.

The gases supplied from the corresponding gas nozzles 60, 64, 68 flow through spaces between the wafers W supported in a multistage manner by the wafer boat 34, and further through the opening 72 to reach the gap 74 between the inner tube 24 and the outer tube 26. Then, the gases are evacuated through the evacuation opening 76 in the manifold 28 by the vacuum evacuation system 78.

Next, a method of supplying each gas is specifically explained with reference to FIG. 3. As described above, the source gas and the reaction gas are alternately repeatedly supplied. FIG. 3(A) illustrates open/close operations of the on-off valve 62B for the source gas; FIG. 3(B) illustrates open/close operations of the on-off valve 66B for the reaction gas; and FIG. 3(C) illustrates open/close operations (or an opening degree of the closure element) of the on-off valve 80B of the vacuum evacuation system.

A thin film is deposited on the wafers W by repeating an adsorption process where the on-off valve 62B for the source gas is opened for a predetermined period of time, thereby allowing the silicon-containing source gas to be adsorbed on the upper surface of the wafers W as shown in FIG. 3(A), an evacuation process where supplying the source gas is terminated and the process tube 22 is evacuated, a reaction process where the on-off valve 66B for the reaction gas is opened to supply the ozone gas, thereby allowing the source gas adsorbed on the upper surface of the wafers W to be reacted with the reaction gas to form a silicon oxide film having a small thickness, and an evacuation process where the flow of the reaction gas is terminated and the process tube 22 is evacuated, in this order.

Here, processes from one adsorption process to the next adsorption process are referred to as one cycle, and therefore the thin film having an extremely small thickness corresponding to one monolayer or several monolayers is formed in one cycle. A time period T1 of the adsorption process and a time period T2 of the reaction process within the one cycle are about 60 seconds; and a time period T3 of the evacuation process in the first half of the one cycle and a time period T4 of the evacuation process in the second half of the one cycle are about 10 seconds. Incidentally, $N_2$ purge gas may be supplied in the evacuation processes. After one such cycle, the thin film is formed as shown in FIG. 4. Namely, before the film deposition, a metal containing film 100 made of, for example, a tungsten film is deposited on the upper surface of the wafer W, and the natural metal oxide film 102 is formed on and in the upper surface of the metal containing film 100 during transporting the wafers W, as described above, as shown in FIG. 4(A). The metal oxide film 102 is expressed as, for example, WOx (x: an integer greater than 1) because the metal containing film 100 is made of tungsten, in this embodiment. After the film deposition, a thin film 104 made of silicon oxide is formed on the metal oxide film 102, as shown in FIG. 4(B). In this case, the metal oxide film 102 is reduced and thus a thickness of the metal oxide film 102 can be controlled because the source gas is supplied and held within the process tube 22, as described later.

In the film deposition method according to this embodiment, the on-off valve 62B is opened thereby supplying the source gas for a first predetermined time period t1 in the adsorption process; and then the on-off valve 62B is closed for a predetermined time period h and the source gas is held inside the process tube 22, as shown in FIG. 3(A). Namely the source gas is not supplied in the entire adsorption process. In addition, the on-off valve 80B of the vacuum evacuation system is kept closed in the entire adsorption process, as shown in FIG. 3(C). In other words, the source gas supplied to the process tube 22 for the first predetermined time period t1 is confined (or stays) in the process tube 22 in the next time period h because the on-off valve 80B of the vacuum evacuation system is closed. As a result, a relatively large amount of the source gas is adsorbed on the upper surface of the metal oxide film 102. In this case, a thickness of the metal oxide film 102 can be controlled by adjusting length of the time period (referred to a hold time hereinafter) h.

For example, a flow rate of the source gas is about 10 to about 500 sccm in the first predetermined time period t1. In addition, an inner pressure of the process tube 22 in the adsorption process T1 is first rapidly increased and becomes constant (e.g., at 667 Pa) at the same time when the on-off valve 62B is closed.

Next, when the adsorption process is completed, the procedure moves onto the first evacuation process T3. Namely, the on-off valve 80B of the vacuum evacuation system is fully opened while no gases are supplied to the process tube 22, thereby rapidly evacuating the remaining gas in the process tube 22. Incidentally, the $N_2$ gas as a purge gas may be supplied into the process tube 22 in order to facilitate evacuating the remaining gas from the process tube 22. With the first evacuation process, a concentration of the source gas (3DMAS) is rapidly decreased.

Next, the procedure moves on to the reaction process T2. Here, the on-off valve 66B for the reaction gas is opened as shown in FIG. 3(B), thereby supplying the ozone gas as the reaction gas to the process tube 22 during the entire time period of the reaction process T2. In this case, the on-off valve 80B of the vacuum evacuation system may be fully opened. Alternatively, the opening degree of the closure element of the on-off valve 80B may be less than or equal to 100% if an evacuation flow rate is sufficient. In the illustrated example, the opening degree of the closure element is constant at 50%.

Incidentally, an oxygen gas is supplied at a flow rate of 6.5 standard liters per minute (slm) to an ozone generator, so that the ozone gas of 200 g/Nm3 is produced, and thus the oxygen gas including this amount of the ozone gas is supplied to the process tube 22. By supplying the ozone gas, the source gas adsorbed on the upper surface of the wafer W is reacted with the ozone gas, thereby forming a thin film 104 made of silicon oxide. In a conventional film deposition method, the ozone gas diffuses through the source gas adsorbed on the upper surface of the wafer W and the thin film 104 to reach the underlying metal-containing film 100, so that the upper surface of the metal-containing film 100 is oxidized, leading to an increased thickness of the metal oxide film 102.

However, because the source gas can be appropriately adsorbed on the upper surface of the wafer W during the hold time h, the ozone diffusion is suppressed, and thus the thickness of the metal oxide film 102 is suppressed. Moreover, the thickness of the metal oxide film 102 may be reduced depending on the length of the hold time h.

In such a manner, when the reaction process T3 is completed, the procedure moves onto the second evacuation process T4. Namely, the on-off valve 80B of the vacuum evacuation system is fully opened while no gases are supplied to the process tube 22, thereby rapidly evacuating the remaining gas in the process tube 22. Incidentally, the $N_2$ gas as a purge gas may be supplied into the process tube 22 in order to facilitate evacuating the remaining gas from the process tube 22. With these procedures, the one cycle is completed, and the same cycle is repeated plural times afterwards. As a result, the thin film 104, which is made of silicon oxide, having a desired thickness is obtained. Incidentally, the inner pressure of the process tube 22 (film deposition pressure) is maintained at a pressure with a range from a base pressure (e.g., about 13.3 Pa) to 133.3 Pa.

As described above, according to this embodiment, there is provided the hold time h in the adsorption process T1 for supplying the source gas to the wafer W, where the source gas is confined within the process tube 22 by closing the on-off valve 62B for the source gas and the on-off valve 80B of the vacuum evacuation system, so that the source gas does not flow out from the process tube 22. Therefore, the thickness of the metal oxide film 102, which has been naturally formed, is prevented from being increased. In addition, the metal oxide film 102 may be reduced by adjusting the length of the hold time h. Namely, the thickness of the metal oxide film 102 can be controlled. As a result, not only the electric properties of the semiconductor device are prevented from being degraded by preventing the increased thickness of the metal oxide film 102, but also the structural defects are prevented.

<Evaluation Tests and Their Results>

Next, results of evaluation experiments that were carried out in order to confirm advantages of the film deposition method according to embodiments of the present invention are explained. FIG. 5 is a graph illustrating a relationship between the hold time and the film deposition rate per cycle; and FIG. 6 is a graph illustrating a relationship between the film deposition rate, the upper surface of the metal-containing film, and the thickness of the metal oxide film. Here, the reaction period T2 is fixed between 1 through 30 seconds and the predetermined time period t1 where the on-off valve 62B for the source gas is opened is fixed between 1 through 30 seconds. In addition, the hold time h (=T1−t1) where the on-off valve 62B for the source gas is closed in the adsorption process is changed by changing the time period of the adsorption process T1.

In FIG. 5, the hold time h is taken as a horizontal axis, and the film deposition rate per cycle is taken as a vertical axis. In addition, the 3DMAS, which contains silicon, was used as the source gas, and the ozone gas (or the oxygen containing ozone of 10 vol. %) was used as the reaction gas. A silicon wafer having the tungsten film deposited thereon, as the metal-containing film 100, and the tungsten oxide film 102 naturally formed on and in the tungsten film was used. Here, a total flow amount of the 3DMAS was set to be one-fourth of that in a comparative example (a conventional condition). A wafer temperature at the time of film deposition was 550° C., and the process pressure is 1.2 kPa at maximum.

In addition, the source gas and the reaction gas were alternately supplied without the hold time, thereby depositing the silicon oxide film in the comparative example. Other film deposition conditions were the same as those in the evaluation experiments according to the embodiment of the present invention. Namely, the adsorption process T1 is 30 seconds, and the total flow amount of 3DMAS is four times of that in the embodiment of the present invention As understood from FIG. 5, as the hold time h is increased from 10 seconds to 115 seconds, the film deposition rate per cycle is linearly increased from 0.1 nm/cycle to 0.21 nm/cycle. This is because an amount of the source gas adsorbed on the upper surface of the wafer W is increased as the hold time h is increased, which leads to an increased film deposition rate.

In addition, while the film deposition rate is about 0.13 nm/cycle when the 3DMAS of X g is supplied in the comparative example, the film deposition rate per cycle can be increased with an increase in the hold time h according to the embodiment of the present invention, although the flow rate of the 3DMAS is reduced to X/4. Specifically, when the hold time is about 40 seconds, the film deposition rate is the same as that in the comparative example. Therefore, it has been found that the film deposition rate that is the same as that in the comparative example can be obtained when the hold time h is set as 40 seconds or more, even when the total flow amount of the source gas is reduced to one-fourth of that in the comparative example. In other words, the total flow amount of the source gas can be greatly reduced by operating the on-off valves according to the embodiment of the present invention.

Next, the thicknesses of the tungsten oxide (WOx) film were measured depending on the film deposition rates. The results are illustrated in FIG. 6. The thickness of the metal oxide film 102, which exists at a boundary between the metal containing film 100 made of tungsten and the silicon oxide film 104, was measured using X-ray electron spectrometry (XPS).

An initial thickness of the tungsten oxide film 102 naturally formed before the film deposition was about 1.1 nm. Incidentally, typical values of the hold time h are written in FIG. 6. A curve A indicates the thickness dependence on the film deposition rate in the case where the film deposition was carried out at a temperature of 550° C. using the 3DMAS as the source gas. As shown in FIG. 6, when the film deposition rate is small, the thickness of the metal oxide film 102 is rather greater than the initial thickness of the naturally formed tungsten oxide film 102. As the film deposition rate becomes greater, the thickness of the metal oxide film 102 is rapidly decreased. Especially, when the film deposition rate is about 0.115 nm/cycle, the thickness of the metal oxide film 102 is substantially the same as the initial thickness. When the film deposition rate becomes further greater, the thickness of the metal oxide film 102 is rather slowly decreased.

From the above results, it has been found that the thickness of the metal oxide (e.g., WOx) film 102 that exists at the boundary between the metal containing film 100 and the thin film (silicon oxide) 104 can be controlled by changing the film deposition rate, which can be adjusted by the hold time h where the source gas is confined in the process tube 22. Specifically, the thickness of the metal oxide film 102 can be smaller than the initial thickness by setting the film deposition rate to be about 0.115 nm/cycle or smaller. In other words, when the hold time h is set to be about 23 seconds or greater (film deposition rate: 0.115 nm/cycle or greater), the thickness of the metal oxide film 102 can be smaller than the initial thickness.

Here, a reason why the thickness of the metal oxide film 102 becomes greater than the initial thickness when the film deposition rate per cycle is smaller than 0.115 nm/cycle may be explained as follows. As shown in FIG. 7(A), when the number of source gas molecules 110 that are adsorbed on the upper surface of the metal containing film 100 is small, there are many gaps between the molecules 110. Therefore, ozone molecules 112 introduced after the source gas molecules 110 are adsorbed on the upper surface of the metal containing film 100 can go through the gaps, as shown by dotted arrows. As a result, the ozone molecules 110 can diffuse into the metal oxide film 102 and the metal containing film 100, and thus the metal containing film 100 is oxidized, thereby increasing the thickness of the metal oxide film 102.

As the film deposition rate per cycle is increased, the number of the silicon source gas molecules 110 adsorbed on the upper surface of the metal oxide film 102 is increased as shown in FIG. 7(B), which decreases the gaps between the source gas molecules 110. As a result, the ozone molecules 112 are impeded from diffusing into the metal oxide film 102 and the metal containing film 100, and thus oxidation of the metal containing film 100 is also impeded.

In addition, a reason why the thickness of the metal oxide film 102 becomes smaller than the initial thickness when the film deposition rate per cycle is 0.115 nm/cycle or greater may be explained as follows. Because the source gas containing silicon per se provides reduction ability at the film deposition temperature of 550° C., the naturally formed metal oxide film 102 can be reduced. As a result, the thickness of the metal oxide film 102 after the film deposition of silicon oxide (see FIG. 4(B)) is smaller than the initial thickness (see FIG. 4(A)).

From the above results, the hold time h is preferably set to be 23 seconds or longer in order to obtain the thickness of the metal oxide film 102 that is smaller than the initial thickness, at the film deposition temperature of 550° C. or more in each process when the 3DMAS is used as the source gas. Incidentally, the film deposition temperature is preferably about 600° C. at a maximum. When the film deposition temperature is greater than 600° C., the source gas adsorbed on the upper surface of the wafer W may be thermally decomposed, rather than oxidized by the ozone gas, which is not advisable from the viewpoint of the ALD (or MLD).

In addition, an additional experiment was carried out using the 3DMAS at a film deposition temperature of 450° C. at the hold time h of only 23 seconds. The other conditions are the same as the above. As shown by a point B in FIG. 6, the result was that the film deposition rate was 0.088 nm/cycle and the thickness of the tungsten oxide film was 1.77 nm, which is greater than the initial thickness of 1.1 nm. This result indicates that the film deposition temperature is preferably 550° C. rather than 450° C.

Moreover, another experiment was carried out using di-iso-propylaminosilane (DIPAS), which belongs to the same aminosilane organic source material family as the 3DMAS, instead of the 3DMAS under the same conditions as the above, except for the hold time h and the film deposition temperature. Point C in FIG. 6 indicates the result of the experiment carried out at the hold time h of 23 seconds at the film deposition temperature of 450° C.; and point D in FIG. 6 indicates the result of the experiment carried out at the hold time h of 23 seconds at the film deposition temperature of 300° C.

As shown in FIG. 6, the film deposition rate is 0.15 nm/cycle and the thickness of the tungsten oxide film is 1.1 nm, which is the same as the initial thickness at the point C. In addition, the film deposition rate is 0.185 nm/cycle and the thickness of the tungsten oxide film is 1.1 nm, which is the same as the initial thickness at the point D.

As shown above, when the DIPAS is used instead of the 3DMAS as the source gas, the film deposition rate is rather greater even at a relatively low film deposition temperature of 450° C., for example, in a range from 300° C. through 450° C. In addition, because the number of the source molecules adsorbed on the upper surface of the wafer W is greater, the oxidation of the tungsten containing film (or growth of the tungsten oxide film) is suppressed.

Figure 8:
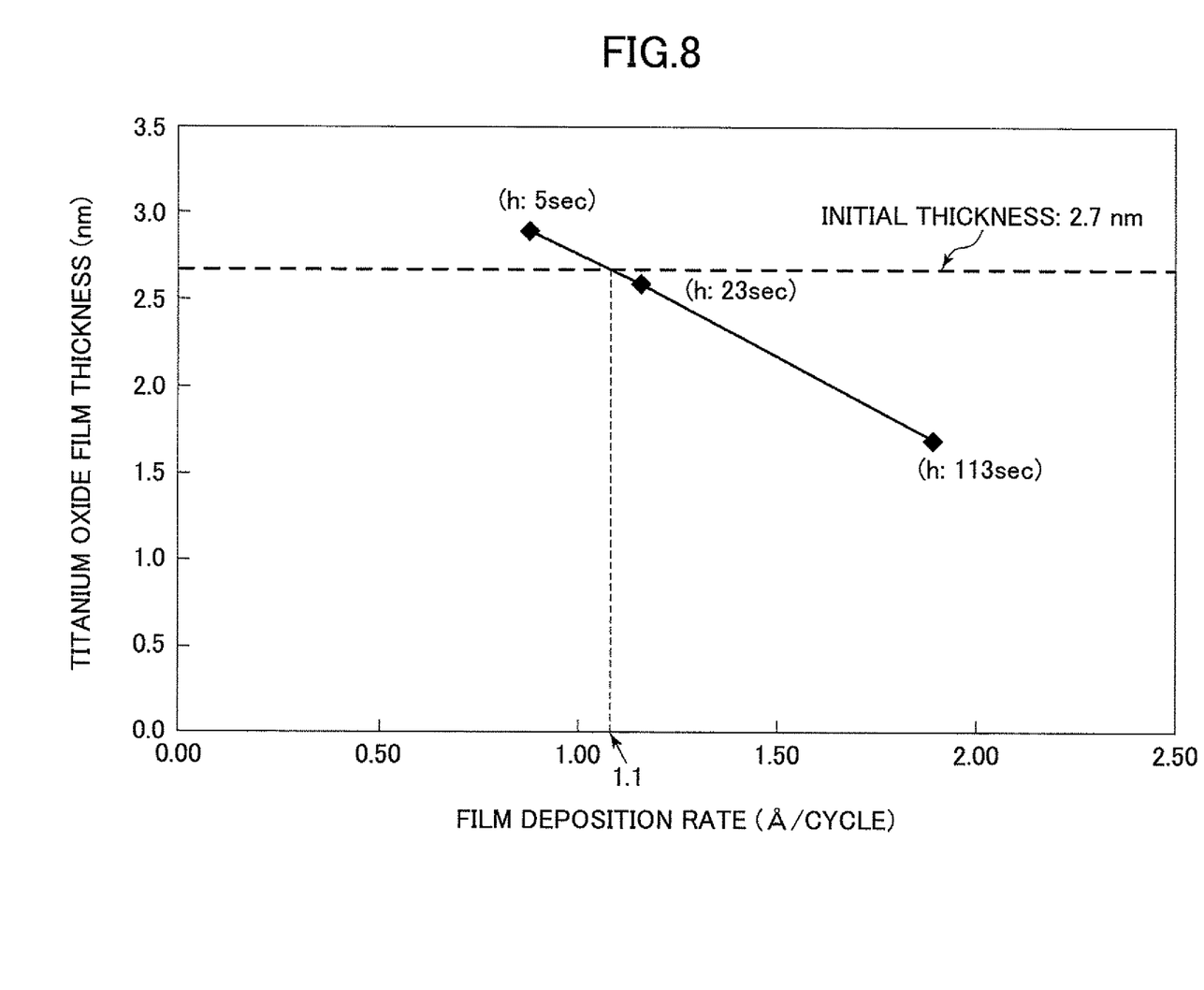
FIG. 8 is a graph that illustrates a relationship between a film deposition rate per cycle and a thickness of a metal oxide film of a TiN film.

Incidentally, while the tungsten film was used as the metal containing film 100 in the above experiments, a titanium nitride (TiN) film was used as the metal containing film 100 in yet another experiment. FIG. 8 illustrates a relationship between a film deposition rate per cycle and a thickness of a metal oxide film of the TiN film. An initial thickness of the metal oxide film was 2.7 nm. In the same manner as that in the experiments whose results are shown in FIG. 6, the hold time h was changed from 5 seconds to 113 seconds.

As shown in FIG. 8, as the hold time h becomes greater, the film deposition rate is increased and the thickness of the titanium oxide film is linearly decreased. When the film deposition rate is relatively small, the thickness of the metal oxide film is greater than the initial thickness, and the thickness of the metal oxide film is substantially the same as the initial thickness at the film deposition rate of 0.11 nm/cycle. As the film deposition rate becomes further greater, the thickness of the metal oxide film becomes decreased. Specifically, the thickness of the metal oxide film is decreased to 1.7 nm from the initial thickness of 2.7 nm.

Incidentally, while the tungsten film and the titanium nitride film were used as the metal containing film in the above experiments, the metal containing film includes other metal films and metal nitride films. Specifically, one selected from a group of a tungsten film, a tungsten nitride film, a titanium film, a titanium nitride film, a tantalum film, and a tantalum nitride film is used as the metal containing film.

In addition, while the 3DMAS was used as the source gas in the above experiments, other aminosilane organic source material such as bis(tertiary-butylamino)silane (BTBAS), tetrakisdimethylaminosilane (4DMAS), di-iso-propylaminosilane (DIPAS), or the like may be used as the source gas.

Moreover, while the ozone gas, which is an oxidizing gas, was used as the reaction gas in the above experiments, one selected from a group of $O_3$, $O_2$, $O_2$ plasma, $N_2O$, and NO may be used as the reaction gas. Furthermore, oxygen active species and hydroxyl group active species that can be produced under a relatively lower pressure of 133 Pa, which are disclosed in Japanese Patent Application Laid-Open Publication, may be used as the reaction gas. In addition, the process tube 22 is merely exemplified. The process tube 22 is not limited to one having the double-tube structure, but may be composed of a single tube.

While the semiconductor substrate is taken as an example of the object to be processed, the semiconductor substrate includes a silicon wafer and a compound semiconductor wafer made of gallium arsenide, silicon carbide, gallium nitride, or the like. In addition, a glass substrate, which is used to fabricate a flat panel display or a liquid crystal display, a ceramic material substrate, and the like are also used in an embodiment of the present invention.

Additional advantages and modifications will readily occur to those skilled in the art. Therefore, the invention in its broader aspects is not limited to the specific details and representative embodiments shown and described herein. Accordingly, various modifications may be made without departing from the sprit or scope of the general inventive concept as defined by the appended claims and their equivalents.

What is claimed is:

1. A film deposition method for depositing a silicon oxide film on a metal containing film formed on an object to be processed, using a film deposition apparatus including:
    a process chamber that accommodates the object to be processed, said process chamber including an inner cylindrical chamber and an outer cylindrical chamber which substantially entirely covers the inner cylindrical chamber;
    a source gas supplying system that includes a first on-off valve and supplies a source gas to the process chamber;
    a reaction gas supplying system that includes a second on-off valve and supplies a reaction gas to the process chamber;
    a vacuum evacuation system that includes a third on-off valve and evacuates the process chamber to vacuum,
    the film deposition method comprising alternately repeating an adsorption step and a reaction step with an interval period therebetween,
    the adsorption step including opening the first on-off valve of the source gas supplying system for a predetermined time period thereby to supply the source gas to the process chamber, closing the first valve after the predetermined time period elapses, and confining the source gas within the process tube for a hold period, thereby allowing the source gas to be adsorbed on the object to be processed, while the third on-off valve of the vacuum evacuation system is closed, and
    the reaction step including opening the second on-off valve of the reaction gas supplying system thereby to supply the reaction gas to the process chamber, thereby allowing the source gas and the reaction gas to react with each other thereby to produce a thin film on the object to be processed, wherein the adsorption step further includes increasing the hold period so that a film deposition rate of the silicon oxide film per cycle is linearly increased.

2. The film deposition method of claim 1, wherein an evacuation step is carried out, the evacuation step including opening the third on-off valve of the vacuum evacuation system thereby to evacuate the process chamber during the interval period.

3. The film deposition method of claim 2, wherein an inert gas is supplied to the process chamber in the evacuation step.

4. The film deposition method of claim 2, wherein supplying the source gas, the reaction gas, and the purge gas is terminated and the process chamber is evacuated in the evacuation step.

5. The film deposition method of claim 1, wherein a time period of closing the first on-off valve of the source gas supplying system in the adsorption step is adjusted thereby to control a thickness of a metal oxide film formed at a boundary between the metal containing film and the silicon oxide film.

6. The film deposition method of claim 5, wherein the time period of closing the first on-off valve of the source gas supplying system is set so that a thickness of the metal oxide film after the time period elapses is smaller than an initial thickness of a metal oxide film that has been naturally formed.

7. The film deposition method of claim 1, wherein a film deposition rate per cycle of repeating the adsorption step and the reaction step is 0.11 nm/cycle or more.

8. The film deposition method of claim 1, wherein the source gas comprises an aminosilane organic material.

9. The film deposition method of claim 8, wherein the aminosilane organic material is tris(dimethylamino)silane and a temperature of the object to be processed is 550° C. or more in the adsorption step and the reaction step.

10. The film deposition method of claim 8, wherein the aminosilane organic material is di-iso-propylaminosilane and a temperature of the object to be processed is 450° C. or less in the adsorption step and the reaction step.

11. The film deposition method of claim 1, wherein the metal containing film is one selected from a group of a tungsten film, a tungsten nitride film, a titanium film, a titanium nitride film, a tantalum film, and a tantalum nitride film.

12. The film deposition method of claim 1, wherein the source gas is produced by evaporating a liquid source in an evaporator.

13. The film deposition method of claim 12, wherein the evaporator includes a source container that is capable of adjusting a vapor pressure of the liquid source, the vapor pressure being determined with a temperature, thereby to control an amount of the evaporated source.

14. The film deposition method of claim 1, wherein the reaction gas comprises one selected from a group of $O_3$, $O_2$, $O_2$ plasma, $N_2O$, and NO.

15. The film deposition method of claim 1, wherein an inert gas is supplied to the process chamber in the evacuation step through an L-shape gas nozzle, said L-shape gas nozzle extending so as to cover substantially entire height of the inner cylindrical chamber.

* * * * *